(12) United States Patent
Yutani et al.

(10) Patent No.: US 8,183,563 B2
(45) Date of Patent: May 22, 2012

(54) ORGANIC TRANSISTOR, ORGANIC TRANSISTOR ARRAY AND DISPLAY APPARATUS

(75) Inventors: Keiichiro Yutani, Kanagawa (JP); Takumi Yamaga, Kanagawa (JP); Takanori Tano, Chiba (JP)

(73) Assignee: Ricoh Company, Ltd., Tokyo (JP)

( * ) Notice: Subject to any disclaimer, the term of this patent is extended or adjusted under 35 U.S.C. 154(b) by 244 days.

(21) Appl. No.: 12/670,313

(22) PCT Filed: Nov. 13, 2008

(86) PCT No.: PCT/JP2008/071065
§ 371 (c)(1),
(2), (4) Date: Jan. 22, 2010

(87) PCT Pub. No.: WO2009/072401
PCT Pub. Date: Jun. 11, 2009

(65) Prior Publication Data
US 2010/0224865 A1 Sep. 9, 2010

(30) Foreign Application Priority Data
Dec. 7, 2007 (JP) .............................. P2007-317380

(51) Int. Cl.
*H01L 33/00* (2010.01)
(52) U.S. Cl. ............. 257/40; 257/E51.006; 257/E33.053
(58) Field of Classification Search .................... 257/40, 257/E51.006, E33.053
See application file for complete search history.

(56) References Cited

U.S. PATENT DOCUMENTS

| | | | |
|---|---|---|---|
| 2005/0140840 A1* | 6/2005 | Hirakata et al. | 349/43 |
| 2005/0274953 A1* | 12/2005 | Kim et al. | 257/66 |
| 2005/0285101 A1* | 12/2005 | Hanson et al. | 257/40 |
| 2006/0043358 A1* | 3/2006 | Ueda et al. | 257/40 |
| 2006/0049395 A1* | 3/2006 | Kobayashi | 257/40 |
| 2007/0259478 A1* | 11/2007 | Arai et al. | 438/99 |
| 2007/0267628 A1* | 11/2007 | Koo et al. | 257/40 |
| 2009/0189148 A1* | 7/2009 | Araumi et al. | 257/40 |
| 2009/0272966 A1* | 11/2009 | Yamaga et al. | 257/40 |
| 2010/0090220 A1* | 4/2010 | Kawasaki et al. | 257/57 |
| 2010/0112751 A1* | 5/2010 | Marrocco et al. | 438/99 |
| 2010/0193775 A1* | 8/2010 | Yutani et al. | 257/40 |
| 2010/0224869 A1* | 9/2010 | Tomino et al. | 257/40 |
| 2011/0248255 A1* | 10/2011 | Kim et al. | 257/40 |

FOREIGN PATENT DOCUMENTS

| | | |
|---|---|---|
| JP | 2003-536260 | 12/2003 |
| JP | 2004-297011 | 10/2004 |
| JP | 2005-310962 | 11/2005 |
| JP | 2006-60079 | 3/2006 |
| WO | WO01/95384 A1 | 12/2001 |

* cited by examiner

*Primary Examiner* — Victor A Mandala
(74) *Attorney, Agent, or Firm* — Cooper & Dunham LLP

(57) ABSTRACT

A disclosed organic transistor includes a substrate; a gate electrode; a gate insulating film; source-drain electrodes; and an organic semiconductor layer. The gate electrode and the gate insulating film are disposed on the substrate in the stated order, and the source-drain electrodes and the organic semiconductor layer are disposed at least on the gate insulating film in the stated order. At least one of the source-drain electrodes includes a first part disposed directly above the gate electrode, a second part disposed not over the gate electrode, and a connecting part which has a width smaller than a width of the first part and connects the first part and the second part.

13 Claims, 16 Drawing Sheets

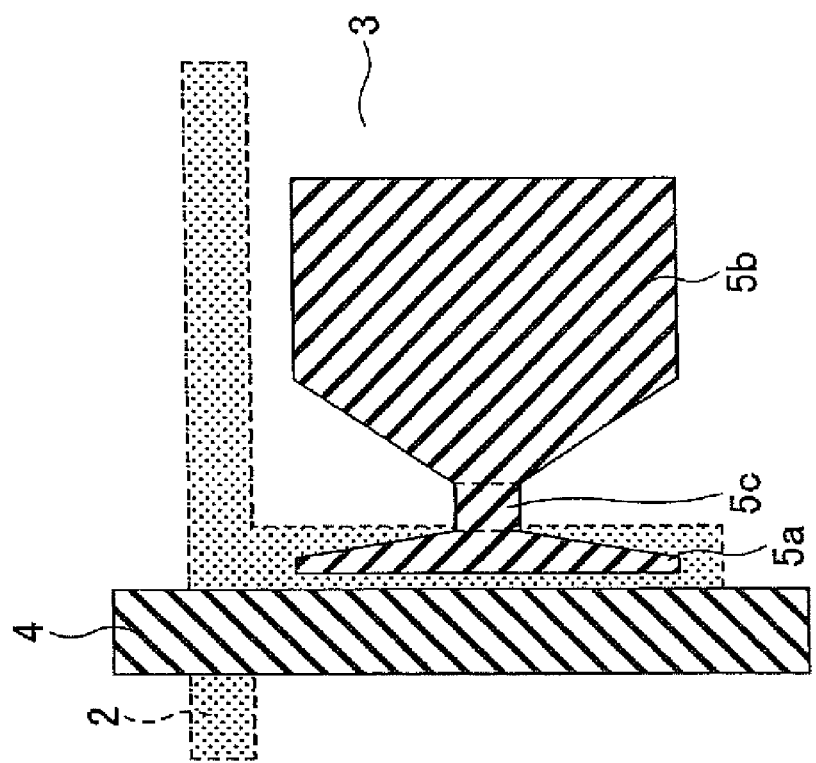
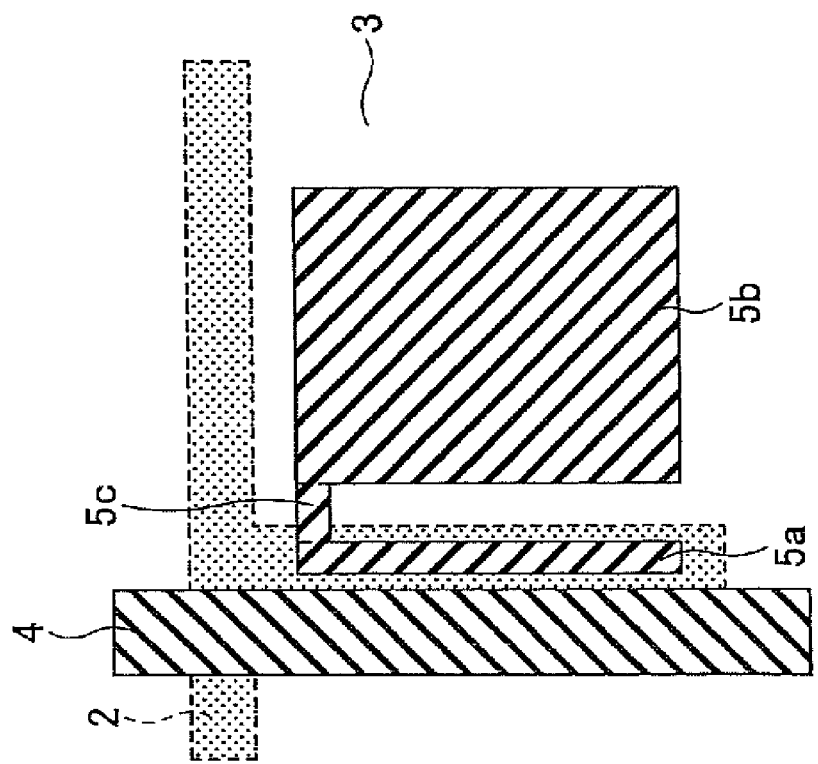

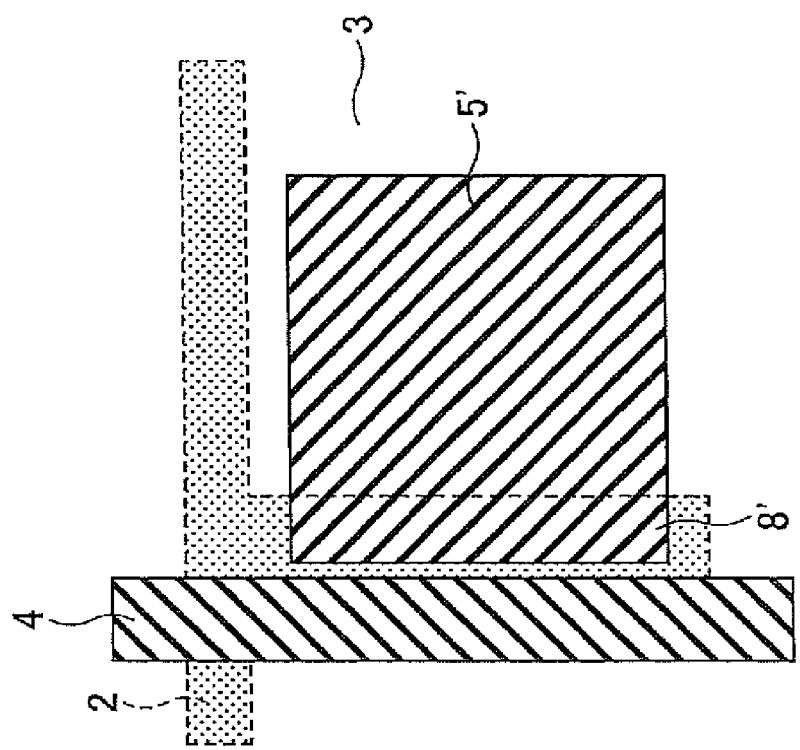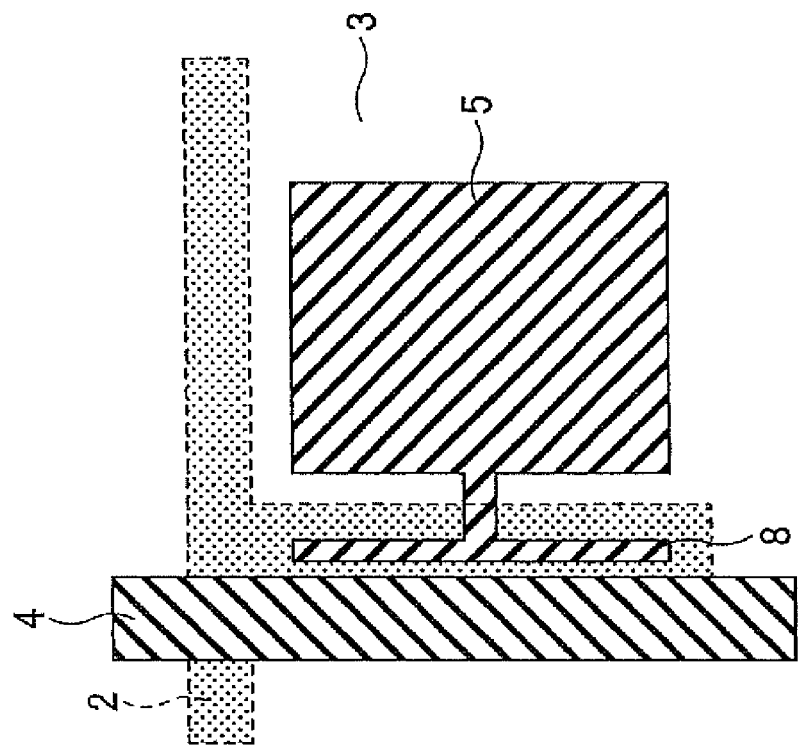

ORGANIC TRANSISTOR, ORGANIC TRANSISTOR ARRAY AND DISPLAY APPARATUS

TECHNICAL FIELD

The present invention is directed to an organic transistor, an organic transistor array and a display apparatus.

BACKGROUND ART

Organic thin film transistors (TFT) made of organic semiconductor materials have been studied with enthusiasm due to the following advantages:

1) diversity of the materials used and high flexibility in processes of manufacture, product forms and the like;
2) ease of large area electronic applications;
3) simple layer structures, which allow simple manufacturing processes; and
4) manufacture with low-cost manufacturing equipment.

In manufacturing of organic TFTs, printing process, a spin coat process and a dipping process are examples of techniques used to form organic semiconductor layers. Accordingly, the organic TFTs can be manufactured at an exceptionally low cost compared to conventional TFTs made of Si semiconductor materials.

When organic TFTs are integrated, a pattern of electrodes needs to be formed. Patent Document 1 discloses a manufacturing method of a laminated structure including the steps of forming a wettability variable layer containing a material whose critical surface tension changes by application of energy, forming a pattern having areas with different critical surface tensions (i.e. a low surface energy area whose critical surface tension is low and a high surface energy area whose critical surface tension is high) by applying energy to a part of the wettability variable layer; forming a conductive layer on the high surface energy area by applying a liquid containing a conductive material to the surface of the wettability variable layer on which the pattern has been formed; and forming a semiconductor layer on the wettability variable layer.

Also, when organic TFTs are formed, an organic semiconductor layer pattern needs to be formed. If organic TFTs are integrated without the organic semiconductor layer pattern formed, an organic semiconductor layer is formed not only within the channel regions but also outside the channel regions, whereby an OFF current occurs when the organic TFTs are in operation, which results in an increase in power consumption. Such an OFF current also causes crosstalk when pixels are displayed. Note that, in creating conventional TFTs including Si semiconductor materials, photolithographic etching is performed to form a Si semiconductor layer pattern.

The pattern formation of the organic semiconductor layer can be achieved by applying a photoresist, exposing and developing a desired pattern to form a resist pattern, and stripping off the resist by etching while using the resist pattern as an etching mask. However, in the case where a polymer material is used as an organic semiconductor material, if a pattern is formed by applying a photoresist on the polymer material, transistor characteristics may be degraded. As for the photoresist, a material is used which is formed by dissolving a novolac-type resin having naphthoquinone diazides as photosensitive groups with an organic solvent, such as a xylene solvent or a cellosolve solvent. It is often the case that a polymer material is soluble in an organic solvent and the like included in the photoresist. Also in the case of using crystalline molecules, such as pentacene molecules, as the organic semiconductor material, the transistor characteristics can be degraded to greater or lesser degrees. Furthermore, the transistor characteristics may be lowered by a remover liquid, such as ethylene glycol monobutyl ether or monoethanol amine, used to remove the resist, or may be degraded when rinsed with deionized water after the resist is removed. Thus, it can be seen that there are many problems associated with the conventional pattern formation of the organic semiconductor layer using photolithographic etching.

Patent Document 2 discloses a method for manufacturing an organic transistor by combining the following processes appropriately: a process of applying first electric charges to a predetermined position on an application surface while applying second electric charges opposite in polarity to the first charges to a coating material to thereby move the electrically-charged material to a predetermined position by Coulomb's force; a process of forming a depression at a predetermined position on the application surface and applying the coating material to the application surface to deposit the coating material in the depression; and a process of forming a pattern by evaporating a solvent included in the coating material after application, and then forming transistors by irradiating the pattern with a laser.

Patent Document 3 discloses a transistor manufacturing method including the steps of providing an electrically conductive layer upon a substrate; providing over the conductive layer a mask having at least one window; etching the conductive layer through the window to form an opening in the conductive layer and sectioning predetermined parts of the conductive layer to thereby form a source and a drain of a transistor; depositing a conductive material through the window to form in the opening a metal gate of the transistor; forming a metal oxide dielectric insulating layer on the gate; and introducing a semiconductor material into a space between the source and the drain, a space over the gate, and a space between the source or the drain, and the gate to thereby form a semiconductor body of the transistor. Note that the etching is carried out such that the conductive layer is undercut at the periphery of the window so that the opening is larger in size than the window in a direction parallel to the surface of the substrate. The deposition of the conductive material is carried out by metal evaporation so that the periphery of the gate closely matches that of the opening, whereby the periphery of the gate is spaced apart from the source and the drain.

However, these disclosed methods leave the problems associated with low throughput, an increase in the cost of manufacturing and the like due to the increased number of process steps.

Regarding the pattern formation method, inkjet printing and dispenser printing are known as examples of such. With these printing methods, a pattern can be drawn directly, whereby the material usage rate can be dramatically improved. Application of inkjet printing or dispenser printing to the pattern formation of the organic semiconductor layer is likely to allow the manufacturing process to be simplified, enable the yield to be improved, and achieve cost reduction. For example, a polymer material soluble in an organic solvent is used as the organic semiconductor material to prepare an organic semiconductor material liquid solution (organic semiconductor ink). Using this liquid solution, an organic semiconductor layer pattern can be formed by inkjet printing.

However, spreading of the organic semiconductor ink after application is a problem. In general, a metal material used for electrodes has a high surface free energy, whereby each droplet of the organic semiconductor ink deposited on the electrodes spreads out. Even if the organic semiconductor ink is applied with aim on the channel region of a transistor, deposited droplets spread since the electrodes occupy a large area. As a result, it is difficult to control the pattern formation of the organic semiconductor layer.

On the other hand, in the case of forming a gate electrode by inkjet printing using Ag ink, there is a limit to making the width of the gate electrode small given the printing precision.

Accordingly, the gate electrode overlaps the source/drain electrode to a greater extent, whereby the parasitic capacitance between these electrodes increases. Furthermore, since the charge mobility is generally low in an organic TFT compared to a TFT including a Si semiconductor material, the organic TFT has a low cutoff frequency, thereby being unable to operate at high speed.

Japanese Laid-open Patent Application Publication No. 2005-310962

Japanese Laid-open Patent Application Publication No. 2004-297011

Published Japanese Translation No. 2003-536260 of the PCT International Publication

DISCLOSURE OF THE INVENTION

The present invention has been made in view of the problems of the above-mentioned conventional technologies, and aims at providing an organic transistor in which the pattern formation of the organic semiconductor layer can be controlled and the overlap between the gate electrode and the source/drain electrode can be reduced. The present invention also aims at providing an organic transistor array having two or more of such transistors as well as a display apparatus including such an organic transistor array.

One of the above objects of the present invention is achieved by an organic transistor including a substrate; a gate electrode; a gate insulating film; source-drain electrodes; and an organic semiconductor layer. The gate electrode and the gate insulating film are disposed on the substrate in the stated order. The source-drain electrodes and the organic semiconductor layer are disposed at least on the gate insulating film in the stated order. At least one of the source-drain electrodes includes a first part disposed directly above the gate electrode, a second part disposed not over the gate electrode, and a connecting part which has a width smaller than that of the first part and connects the first part and the second part.

Another one of the above objects of the present invention is achieved by an organic transistor array including multiple organic transistors, each of which includes a substrate; a gate electrode; a gate insulating film; source-drain electrodes; and an organic semiconductor layer. The gate electrode and the gate insulating film are disposed on the substrate in the stated order. The source-drain electrodes and the organic semiconductor layer are disposed at least on the gate insulating film in the stated order. At least one of the source-drain electrodes includes a first part disposed above the gate electrode, a second part, and a connecting part which has a width smaller than that of the first part and connects the first part and the second part. The organic semiconductor layer is formed by a printing process.

Another one of the above objects of the present invention is achieved by a display apparatus including an organic transistor array that includes multiple organic transistors, each of which includes a substrate; a gate electrode; a gate insulating film; source-drain electrodes; and an organic semiconductor layer. The gate electrode and the gate insulating film are disposed on the substrate in the stated order. The source-drain electrodes and the organic semiconductor layer are disposed at least on the gate insulating film in the stated order. At least one of the source-drain electrodes includes a first part disposed above the gate electrode, a second part, and a connecting part which has a width smaller than that of the first part and connects the first part and the second part. The organic semiconductor layer is formed by a printing process.

BRIEF DESCRIPTION OF THE DRAWINGS

FIG. 5 is a top view showing another geometry of the drain electrode of the organic transistor of FIG. 1;

FIG. 6 is a top view showing an overlap area of a gate electrode and the drain electrode;

BEST MODE OF CARRYING OUT THE INVENTION

Embodiments that describe the best mode for carrying out the present invention are explained next with reference to the drawings.

Figure 1:
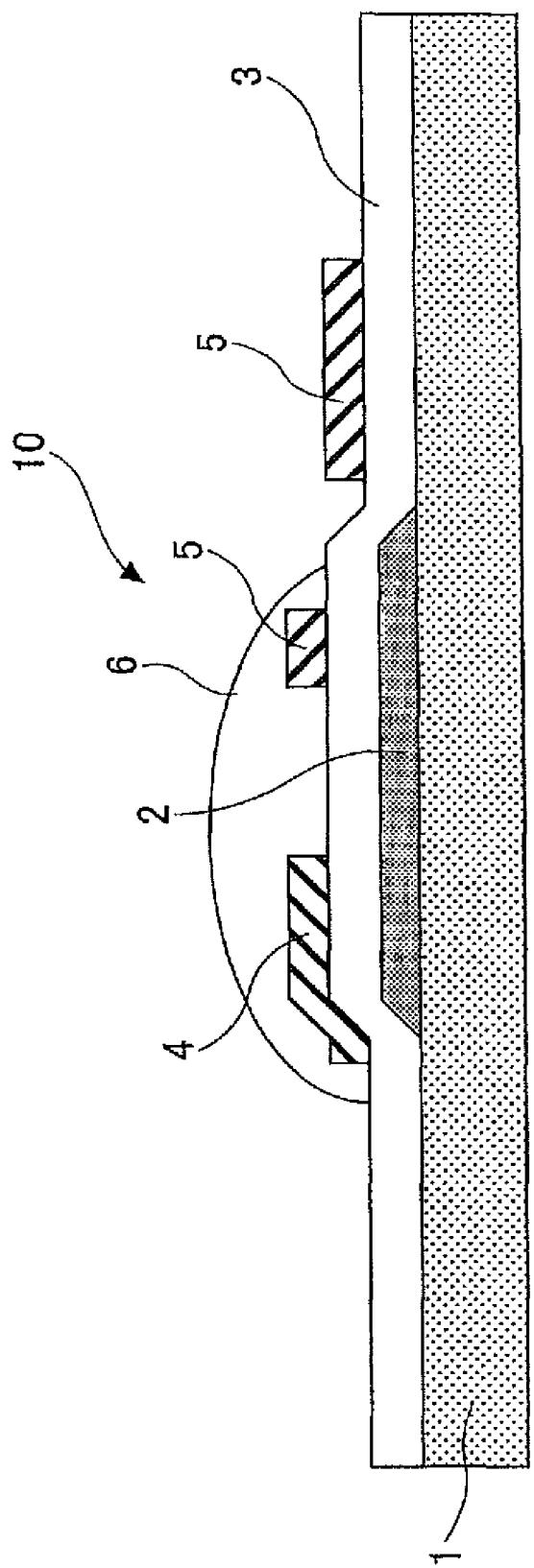
FIG. 1 is a cutaway view of one example of an organic transistor according to one embodiment of the present invention.
Figure 2:
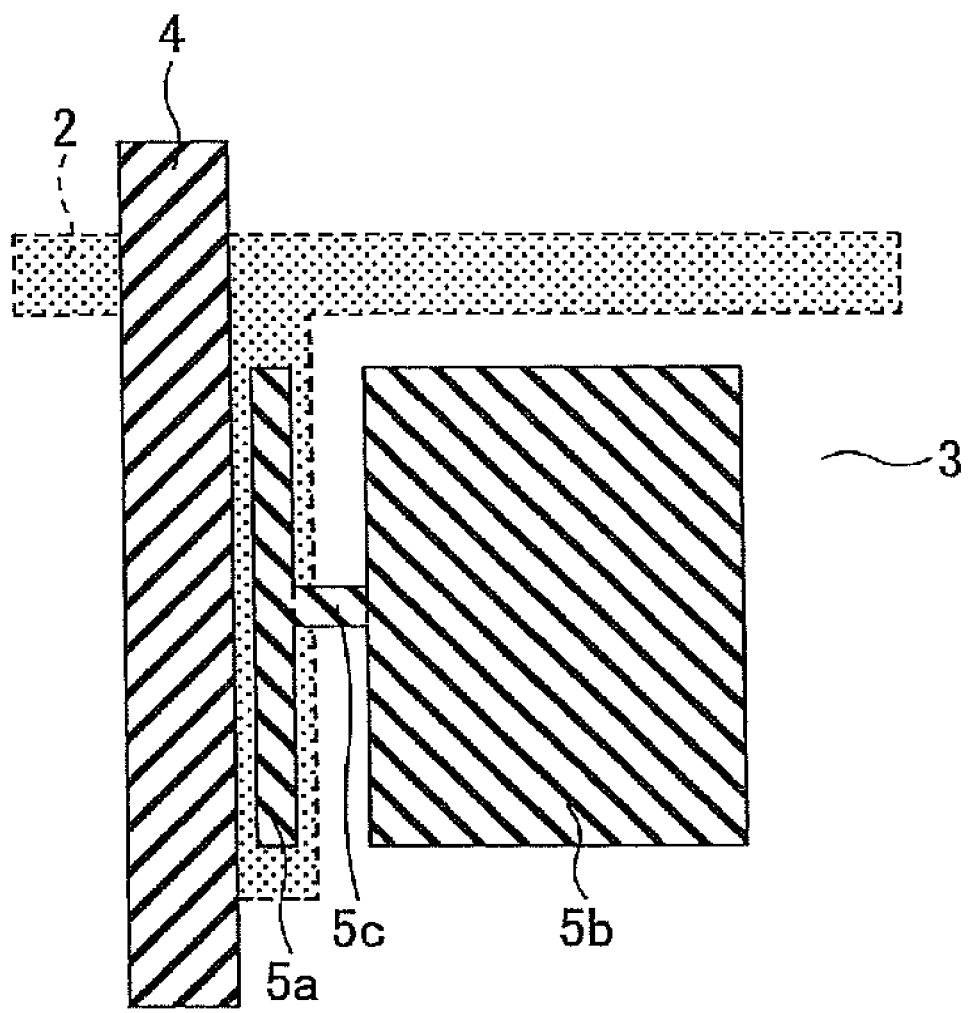
FIG. 2 is a top view showing a geometry of a drain electrode of the organic transistor of FIG. 1.
Figure 3:
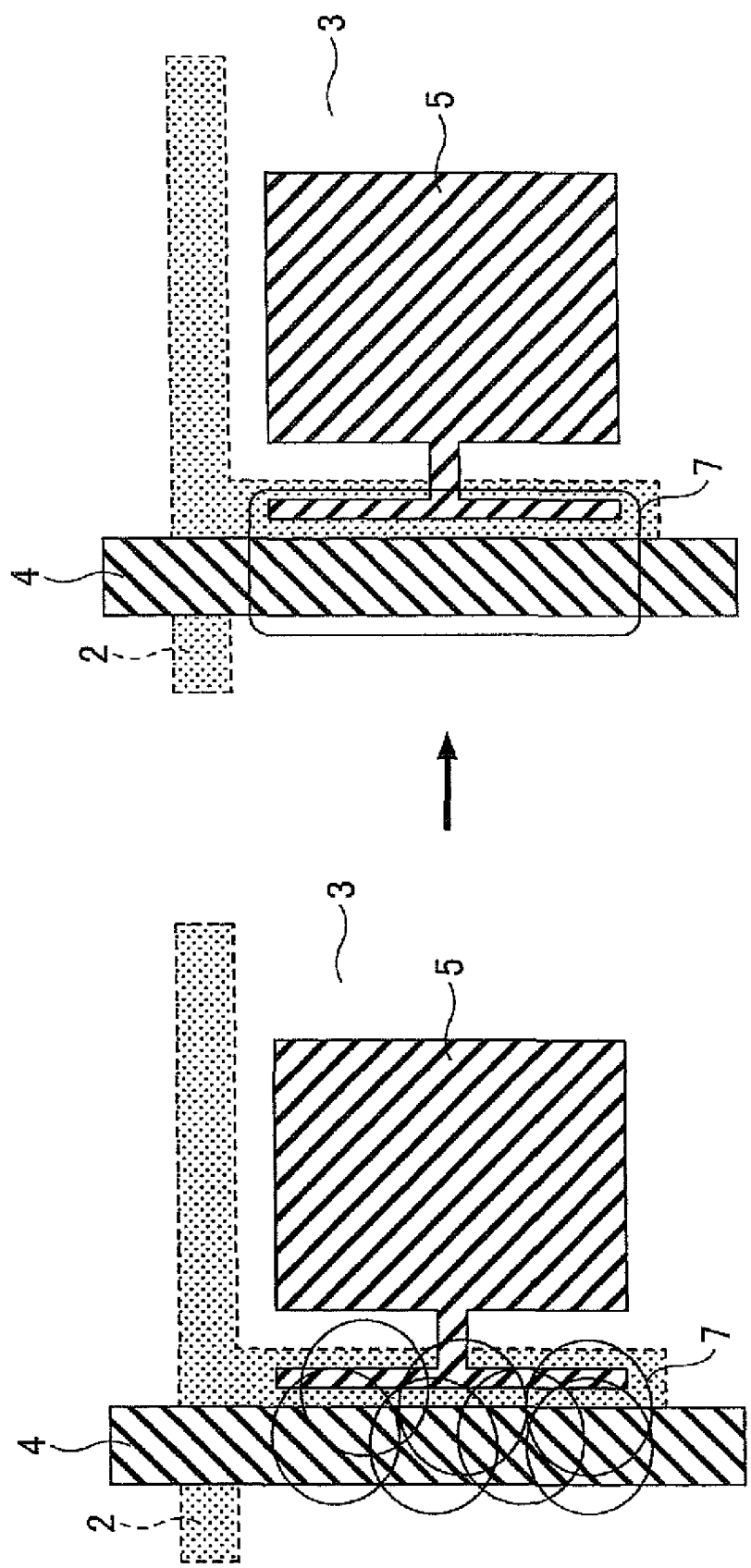
FIG. 3 is a top view showing spread of an organic semiconductor ink in the case where the drain electrode of the organic transistor of FIG. 1 is used.

FIG. 1 shows an example of the organic transistor according to an embodiment of the present invention. As for an organic transistor 10, a gate electrode 2 and a gate insulating film 3 are sequentially formed on a substrate 1, and a source electrode 4 and a drain electrode 5 and then an organic semiconductor layer 6 are sequentially formed on the gate insulting film 3. The drain electrode 5 includes a first part 5a formed above the gate electrode 2, a second part 5b, and a connecting part 5c which has a width smaller than the width of the first part 5a (i.e. channel width) and connects the first part 5a and the second part 5b, as shown in FIG. 2. The organic semiconductor layer 6 is formed by a printing process, such as inkjet printing or dispenser printing. In this way, the surface area of the drain electrode 5 having high surface free energy is reduced. As a result, when a pattern of the organic semiconductor layer 6 is formed using an organic semiconductor ink 7, it is possible to control the spread of the organic semiconductor ink 7 (see FIG. 3). In addition, due to gaps formed between the first part 5a and the second part 5b, the spread of the organic semiconductor ink 7 is controlled. Specifically, the spread of the organic semiconductor ink 7 is prevented by the gate insulating film 3 exposed between the first part 5a and the second part 5b.

The part of the gate insulating film 3, on which neither the source electrode 4 nor the drain electrode 5 are formed, preferably has a surface energy of 40 mN/m or less. If this part has a surface energy exceeding 40 mN/m, it becomes difficult to prevent the spread of the organic semiconductor ink 7.

In the above-described manner, the printing precision of the organic semiconductor layer 6 is improved, whereby it is possible to obtain the organic transistor 10 in which a pattern of the organic semiconductor layer 6 is formed with high precision. In addition, since the spread of the organic semiconductor ink 7 can be controlled, the organic semiconductor layer 6 is prevented from becoming thin. Furthermore, it is possible to prevent the organic semiconductor layer 6 from having an uneven thickness and exhibiting a crater-like shape, which can be explained by the coffee stain effect, or becoming discontinuous. This means that the concentration of the organic semiconductor ink 7 can be reduced, which results in a decrease of the amount of the organic semiconductor material to be used. Moreover, the overlap between the gate electrode 2 and the drain electrode 5 is reduced, and it is therefore possible to prevent insulation failure and operate the transistor at high speed.

Figure 4:
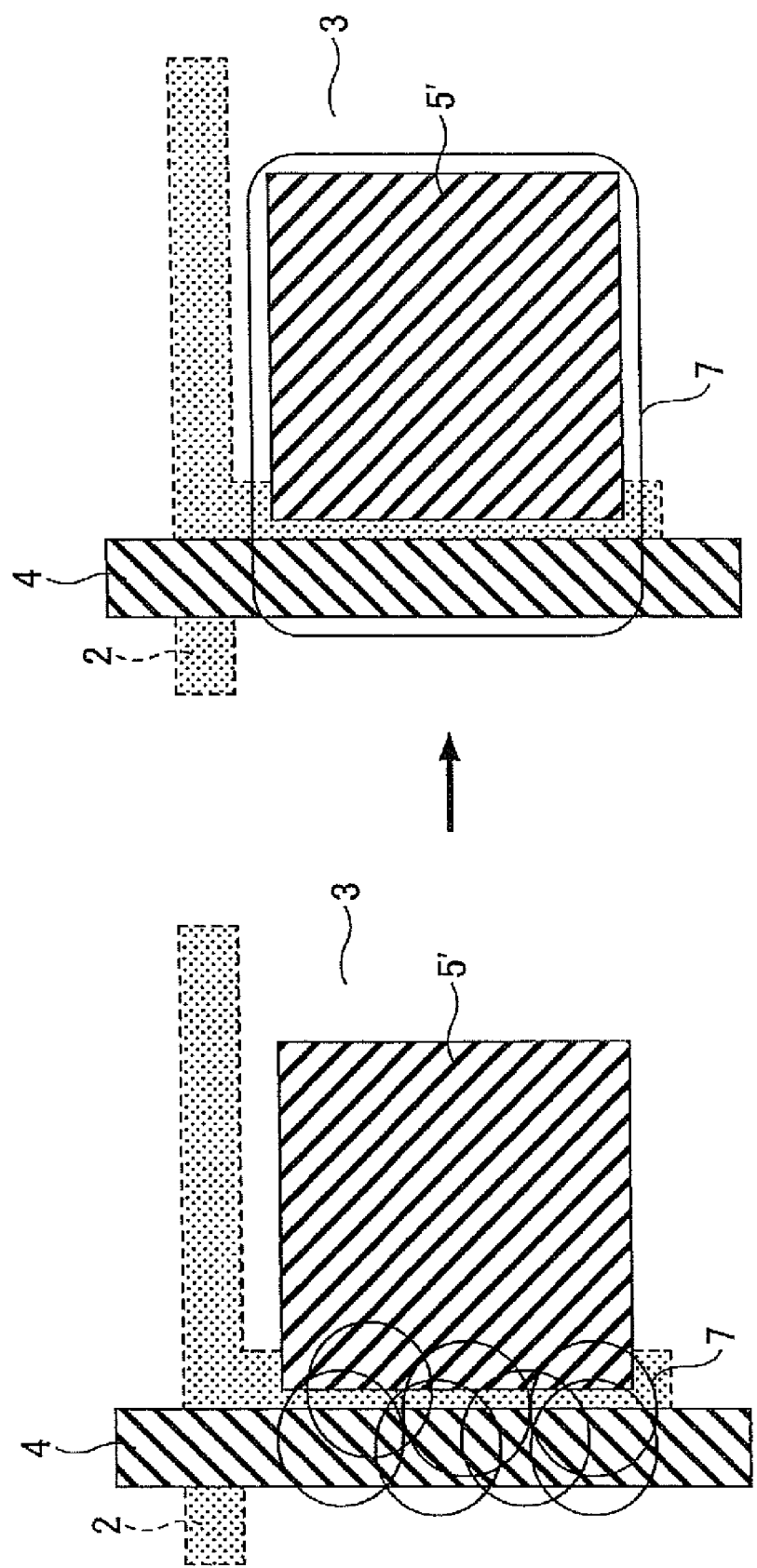
FIG. 4 is a top view showing spread of the organic semiconductor ink in the case where the drain electrode having a conventional geometry is used.

On the other hand, consider the case where a drain electrode 5' having a conventional geometry is formed. In forming an organic semiconductor layer by a printing process in the channel region, the organic semiconductor ink 7 spreads out, as shown in FIG. 4. It is thus difficult to form a pattern of the organic semiconductor layer 6 with high precision, and accordingly, a large alignment margin has to be provided. In addition, since the organic semiconductor ink 7 tends to spread over the drain electrode 5' having high surface energy, the organic semiconductor layer 6 is formed thin. The organic semiconductor layer 6 also tends to exhibit a crater-like shape and have an uneven thickness, and it therefore becomes difficult to make a continuous organic semiconductor layer 6.

Note that the connecting part 5c is not necessary to connect the first part 5a and the second part 5b in the middle of the channel region, and may connect them, for example, near the edge of the channel region (see FIG. 5A). The first part 5a and the second part 5b are not limited to a rectangular shape, and may individually be, for example, a quadrilateral shape (e.g. trapezoid) or a different polygonal shape (see FIG. 5B), or may have a curved section. Further, the connecting part 5c may have a length of zero, for instance, in the case of FIG. 5B.

A drain current $I_{ds}$ of a field-effect transistor is expressed by the following equations:

$$I_{ds} = W/2L \times \mu \times C_i \times (V_g - V_{th})^2$$

$$C_i = \epsilon_0 \times \epsilon_r \times S/t$$

where W is the channel width; L, the channel length; $\mu$, the mobility; $C_i$, the capacitance of the gate insulating film per unit area; $V_g$, the gate voltage; $V_{th}$, the threshold voltage; $\epsilon_0$, the vacuum permittivity; $\epsilon_r$, the relative permittivity of the gate insulating film; S, the area of electrodes; and t, the thickness of the gate insulating film. It can be seen from the equations that $C_i$ should be increased in order to increase $I_{ds}$. It is also understood that $\epsilon_r$ or S should be increased, or t should be reduced, in order to increase $C_i$. $\epsilon_r$ depends on a material of the gate insulating film, and S is limited by the pixel size. As for the organic transistor 10, an overlap area 8 of the gate electrode 2 and the drain electrode 5 (see FIG. 6A) is smaller than an overlap area 8' of the gate electrode 2 and the drain electrode 5' having a conventional geometry (see FIG. 6B). As a result, the gate leakage current can be reduced, and therefore, t can be reduced, enabling an increase in $I_{ds}$.

A cutoff frequency $f_c$ of a field-effect transistor is expressed by the following equation:

$$f_c = \mu \times V_{ds}/2\pi/L(L+D)$$

where $V_{ds}$ is the drain voltage; and D is the width of an overlap area of the gate electrode and the drain electrode. According to the equation, it can be seen that D should be reduced in order to increase $f_c$. That is, if the parasitic capacitance is reduced, the field-effect transistor can be made to operate at high speed. As for the organic transistor 10, since the width of the overlap area 8 is small, as shown in FIG. 6A, it is possible to cause the organic transistor 10 to operate at high speed.

In an organic transistor of an embodiment of the present invention, the source electrode 4 may include a first part, a second part and a connecting part as in the case of the drain electrode 5 of the organic transistor 10. Alternatively, each of the source electrode 4 and the drain electrode 5 may have a first part, a second part and a connecting part.

In the present invention, the pattern of the organic semiconductor layer 6 is preferably formed using an organic semiconductor ink made by dissolving an organic semiconductor material with an organic solvent. The organic semiconductor material soluble in an organic solvent is not particularly limited, and a polymer material, an oligomer material, a low molecular material, or the like can be used. Examples are organic low molecules such as pentacene, anthracene, tetracene and phthalocyanine; conductive polymers of the polyacetylene series; conductive polymers of the polyphenylene series, such as polyparaphenylene and its derivatives, and polyphenylenevinylene and its derivatives; conductive polymers of the heterocyclic series, such as polypyrrole and its derivatives, polythiophene and its derivatives, polyfurane and its derivatives; and ionic conductive polymers, such as polyaniline and its derivatives. Polymer materials having a triarylamine structure are particularly preferable. Such a polymer material is not particularly limited; however, a material expressed by a chemical formula (A) can be used. This material is a randomly oriented polymer material, and has little characteristic variation regardless of the shape of the formed layer and the layer forming method.

[Chemical Formula (A)]

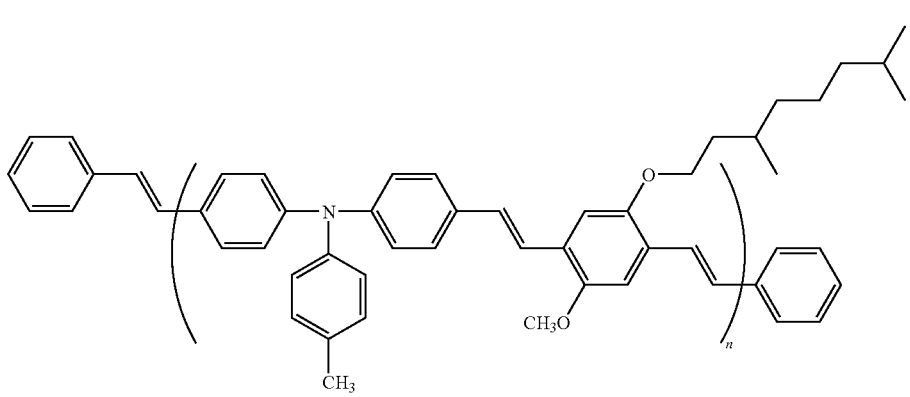

A pattern of at least one of the gate electrode 2 and the source/drain electrodes 4 and 5 may be formed by a printing process, such as inkjet printing or dispenser printing. In the printing process, it is preferable to use metal ink including metal particles or a metal complex. The metal particles are not particularly limited, and examples of such are Au, Ag, Cu, Pt, Pd, Ni, Ir, Rh, Co, Fe, Mn, Cr, Zn, Mo, W, Ru, In and Sn. Any two or more of these may be used together. Among them, Au, Ag, Cu and Ni are preferable from the standpoint of electrical resistance, heat conductivity and corrosion. It is known that, if the metal particles have an average particle diameter of several nanometers to several tens of nanometers and are dispersed in a solvent medium, the particles are sintered at a significantly low temperature. This is attributed to the influence of active surface atoms becoming greater as the particle diameter of the metal particles decreases. The metal complex is not particularly limited, and examples of such are complexes having Au, Pt, Ag, Cu, Pd, In, Cr, Ni or the like as a central metal. Patterns are formed using such metal ink, and then sintered to form the gate electrode 2, the source electrode 4 and the drain electrode 5.

If the surface tension and viscosity of the metal ink are not adequate, the metal ink is not discharged well, or discharged not at all, in the printing process. In such a case, the metal ink is difficult to form round droplets, and it is sometimes the case that the ligament length increases. In view of these aspects, the metal ink preferably has a surface tension of about 30 mN/m and a viscosity of 2 to 13 mPa·sec, more preferably 7 to 10 mPa·sec. The metal ink should also have a drying property which prevents the solvent from volatilizing when the metal ink is discharged so that the metal particles or the metal complex does not become solidified.

To form these electrodes 2, 4 and 5, a dispersion liquid of a conductive polymer or the like may be used. As for the conductive polymer, examples are polythiophene, polyaniline, polypyrrole, polyparaphenylene, polyacetylene, and any of these polymers on which doping has been performed. Particularly, a complex (PEDOT/PSS) of polyethylene dioxythiophene (PEDOT) and polystyrene sulfonate (PSS) is preferable in the standpoint of electrical conductivity, stability, heat resistance and the like. Compared to metals, conductive polymers have no advantage in terms of electrical characteristics and stability. However, they have advantages in the degree of polymerization; allowing the electrical characteristics of the electrodes to be improved by the structures of the conductive polymers; and allowing the formation of the electrodes at a low temperature since they do not require sintering.

If the surface energy of the gate insulating film 3 which is not irradiated with ultraviolet is 40 mN/m or less, an area with a high surface energy is formed by applying ultraviolet rays. Herewith, it is possible to form a pattern of the source electrode 4 and the drain electrode 5 with high precision by the printing process. The gate insulating film 3 is made of a polymer material, such as polyimide, polyparaxylene, polyvinylphenol, polyester, an acrylic resin (e.g. polyacrylonitrile or polymethylmethacrylate), an epoxy resin, or a thermoset resin.

In order to cause the gate insulating film 3 to have a surface energy of 40 mN/m or less, it is preferable to introduce lyophobic functional groups to the surface of the gate insulating film 3, and a self assembled monolayer (SAM) may be used for this purpose. Specifically, a functional monolayer is provided on the surface of the gate insulating film 3 using a chemical compound that includes lyophobic functional groups and functional groups that bind with the surface of the gate insulating film 3. As for the functional groups that bind with the surface of the gate insulating film 3, examples are a halosilyl group and an alkoxysilyl group. These functional groups react with a hydroxyl group on the surface of the gate insulating film 3 to initiate a hydrolysis reaction, and are thereby adsorbed onto the surface of the gate insulating film 3. As for the lyophobic functional group, examples are an alkyl group having a fluoro group, a long chain fatty alkyl group, and an alkyl group having a phenyl group.

Also, in order to cause the gate insulating film 3 to have a surface energy of 40 mN/m or less, the gate insulating film 3 may be formed using a material containing lyophobic functional groups.

Figure 7:
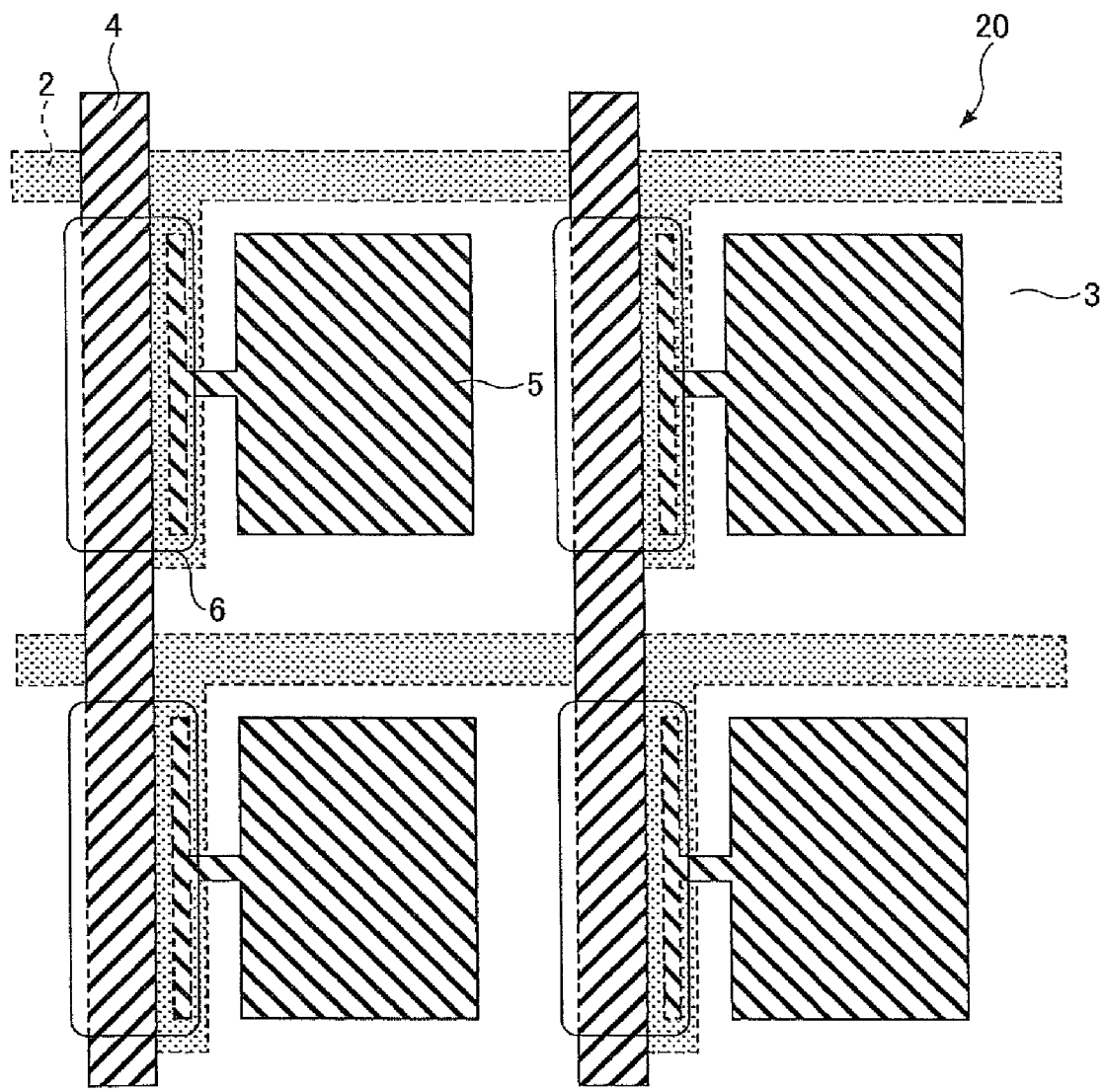
FIG. 7 shows a top view of the first example of an organic transistor array according to one embodiment of the present invention.

FIG. 7 shows a first example of an organic transistor array according to one embodiment of the present invention. An organic transistor array 20 includes multiple organic transistors 10.

Figure 8:
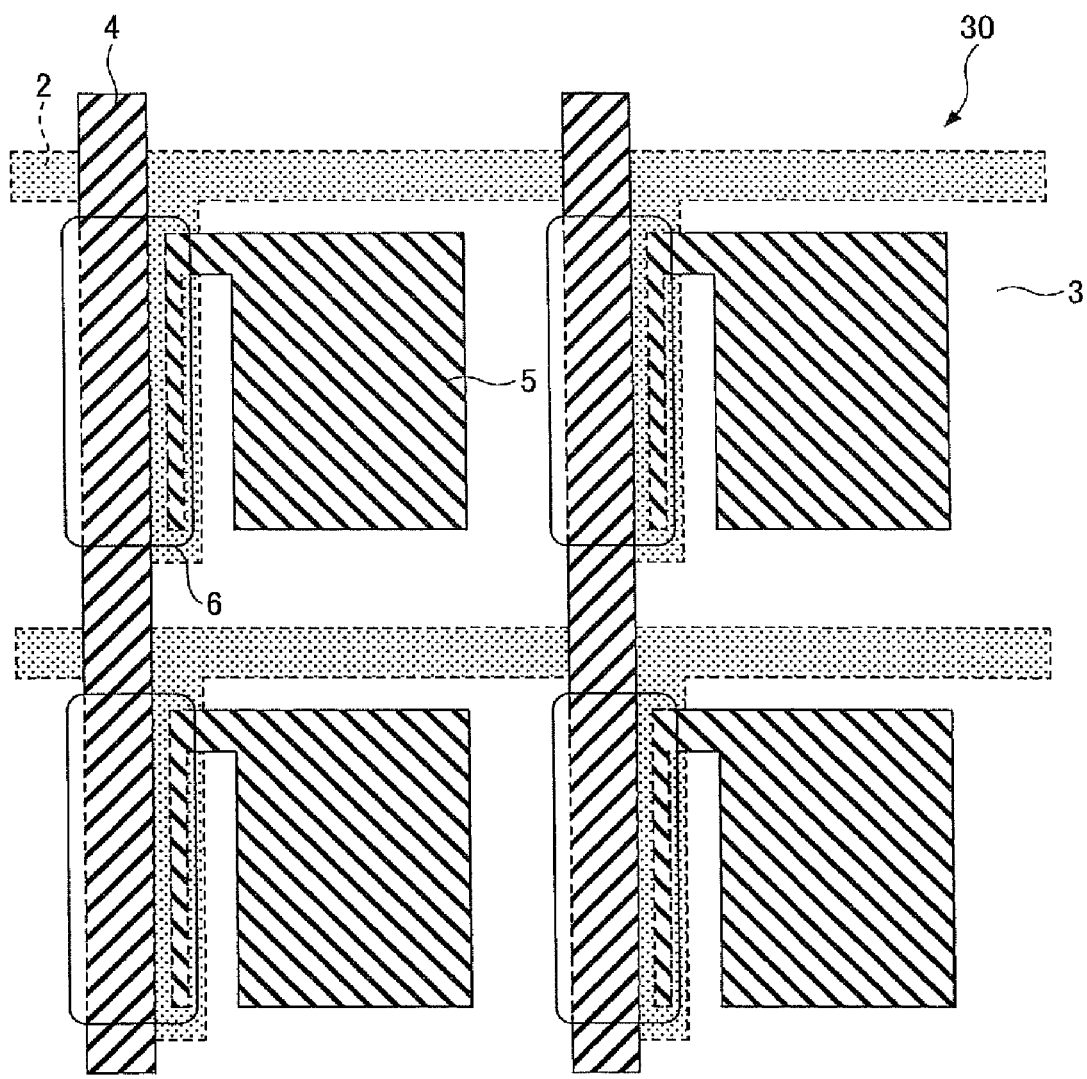
FIG. 8 shows a top view of the second example of the organic transistor array according to one embodiment of the present invention.

FIG. 8 shows a second example of an organic transistor array according to one embodiment of the present invention. An organic transistor array 30 includes multiple organic transistors each having the same structure as that of the organic transistor 10, except for the drain electrode 5 which has a geometry illustrated in FIG. 5A.

Figure 9:
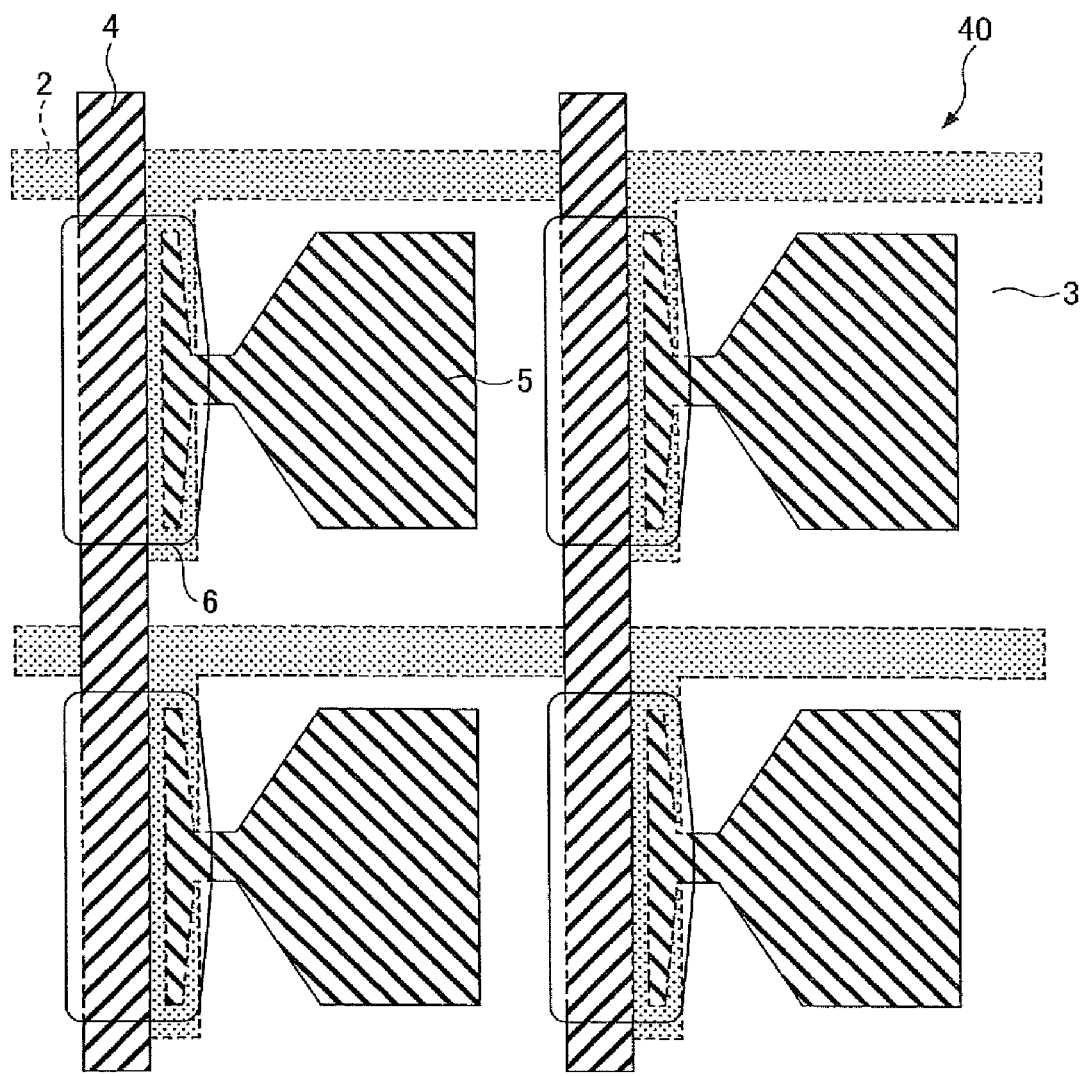
FIG. 9 shows a top view of the third example of the organic transistor array according to one embodiment of the present invention.

FIG. 9 shows a third example of an organic transistor array according to one embodiment of the present invention. An organic transistor array 40 includes multiple organic transistors each having the same structure as that of the organic transistor 10, except for the drain electrode 5 which has a geometry illustrated in FIG. 5B.

Figure 10:
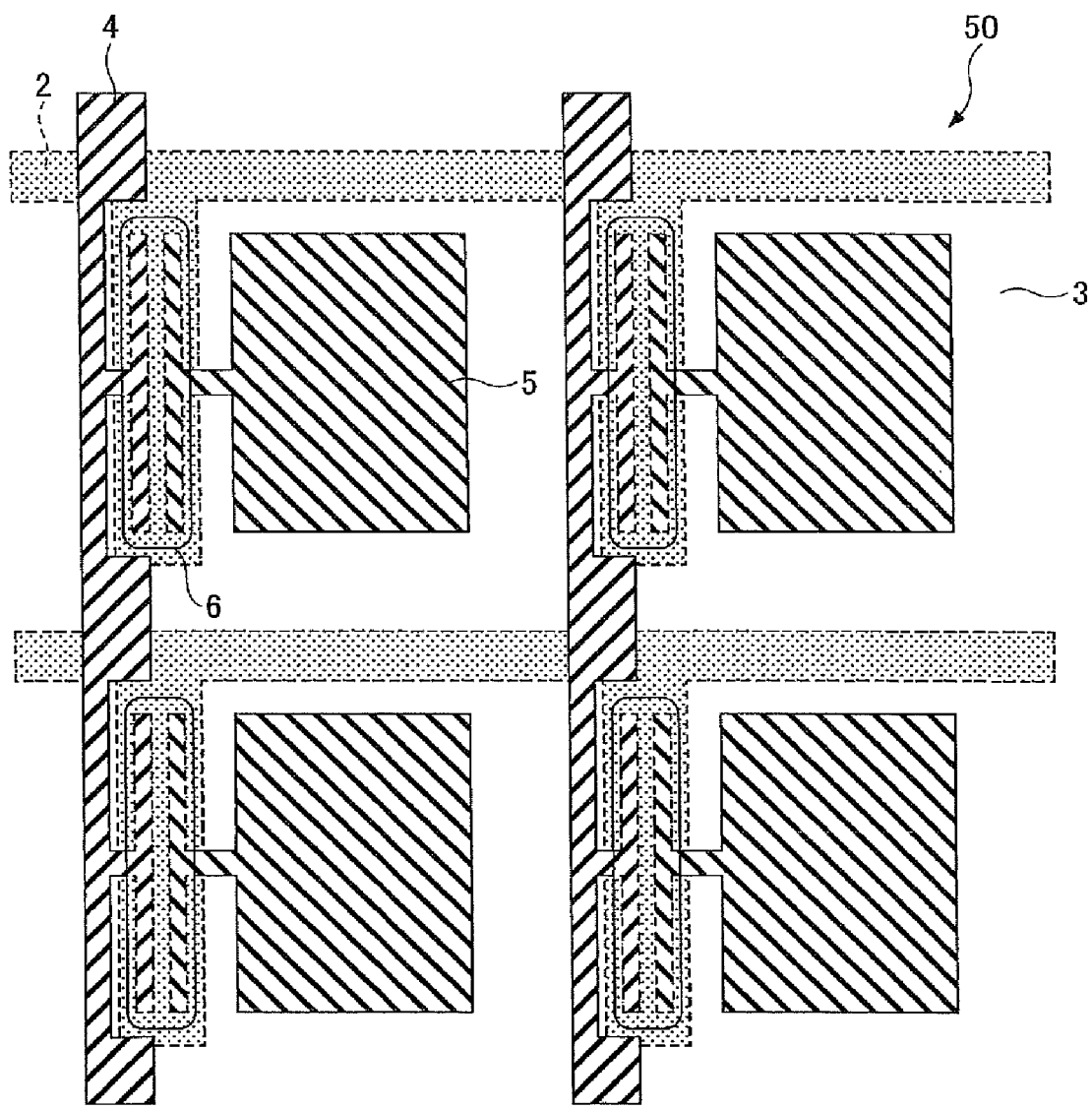
FIG. 10 shows a top view of the fourth example of the organic transistor array according to one embodiment of the present invention.
Figure 11:
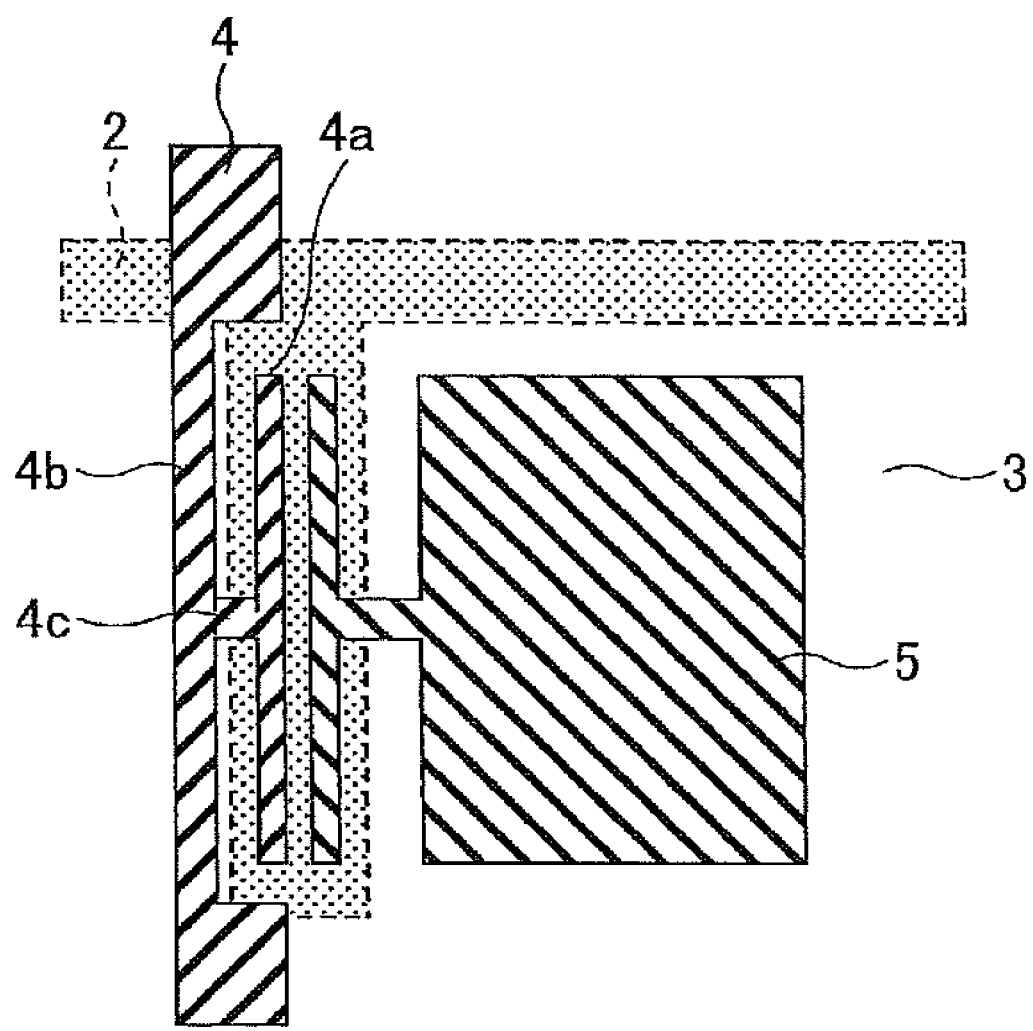
FIG. 11 is a top view showing a geometry of a source electrode of the organic transistor array of FIG. 10.

FIG. 10 shows a fourth example of an organic transistor array according to one embodiment of the present invention. An organic transistor array 50 includes multiple organic transistors each having the same structure as that of the organic transistor 10, except for the geometry of the source electrode 4 which is one illustrated in FIG. 11. The source electrode 4 of FIG. 11 includes a first part 4*a* formed on the gate electrode 2, a second part 4*b*, and a connecting part 4*c* which has a width smaller than the width of the first part 4*a* (i.e. channel width) and connects the first part 4*a* and the second part 4*b*.

An active matrix display apparatus can be obtained by using an active matrix substrate that includes the organic transistor array of one embodiment of the present invention as an active matrix device, and combining the active matrix substrate with pixel display devices such as electrophoresis devices, liquid crystal devices, or organic EL devices.

The following describes an example of the manufacturing method of the active matrix display apparatus. First, as shown in FIG. 1, the gate electrodes 2 (scanning lines) are formed on the glass substrate (or film substrate) 1 by inkjet printing using Ag ink in which Ag particles are dispersed. Next, polyamic acid is applied onto the gate electrodes 2 by spin-coating and then sintered to form the gate insulating film 3. The gate insulating film 3 is irradiated with ultraviolet through a photomask to form a high energy pattern on the surface of the gate insulating film 3. On the high energy pattern, the source electrodes 4 and the drain electrodes 5 (signal lines) are formed by inkjet printing using Ag ink in which Ag particles are dispersed. Then, the organic semiconductor layer 6 is formed by inkjet printing using an organic semiconductor ink. Next, a protective layer (not shown) having a thickness of 2 μm and made of paraxylylene is formed by chemical vapor deposition (CVD) to complete an active matrix substrate.

On the other hand, on a counter substrate to oppose the active matrix substrate, ITO (Indium Tin Oxide) is applied by sputtering to thereby form a transparent conductive film having a thickness of about 100 nm. On the transparent conductive film, polyamic acid is applied by spin-coating to form a film, which is then rubbed in an orientation process to form an oriented film having a thickness of about 200 nm. Using the counter substrate on which the oriented film is formed in this manner, a liquid crystal panel can be manufactured by joining the counter substrate and the active matrix substrate together with a silica spacer interposed between them and then filling the gap with a liquid-crystalline material.

Also, an electrophoresis display panel can be manufactured by joining a counter substrate on which a transparent conductive film and the active matrix substrate together with a silica spacer interposed between them and then filling the gap with microcapsules (electrophoresis devices).

Also, an organic EL panel can be manufactured by forming organic EL devices on the active matrix substrate and then providing an atmosphere shielding member.

EXAMPLES

Example 1

The organic transistor 10 of Example 1 is made in the following manner. An adhesion layer (not shown) made of Cr and having a thickness of 3 nm and the gate electrode 2 made of Al and having a thickness of 100 nm are formed on the glass substrate 1 by vacuum evaporation using a shadow mask. On the gate electrode 2, RIKACOAT SN-20 (produced by New Japan Chemical co., ltd), which is a polyimide liquid solution, is applied by spin-coating, and is prebaked and then baked at 200° C. to thereby form a lower layer (500 nm in thickness) of the gate insulating film 3. On the lower layer of the gate insulating film 3, a polyimid liquid solution expressed by a chemical formula (B) is applied by spin-coating in a similar manner, and then baked to form an upper layer of the gate insulating film 3. Note that the surface energy of the gate insulating film 3 is 30 mN/m.

The upper layer of the gate insulating film 3 is irradiated with UV light through a photomask to thereby form a pattern (areas having a high surface energy) used to form the source electrode 4 and the drain electrode 5 having a geometry illustrated in FIG. 2.

Then, on the pattern, Ag ink is applied by inkjet printing and then sintered at 280° C. to thereby form the source electrode 4 and the drain electrode 5 having a thickness of 100 nm. The channel length (i.e. distance between the source electrode 4 and the drain electrode 5) is 5 μm. On the gate insulating film 3 on part of which the source electrode 4 and the drain electrode 5 have been formed, the organic semiconductor layer 6 is formed by inkjet printing using a liquid solution expressed by the chemical formula (A) to thereby obtain the organic transistor 10.

Comparative Example 1

An organic transistor of Comparative Example 1 has the same structure as that of the organic transistor 10 of Example 1, except for the drain electrode 5 which has a geometry illustrated in FIG. 4.

[Evaluation Method and Results]

By using the organic transistors of Example 1 and Comparative Example 1, the dimensions of the organic semiconductor layers 6 and the transistor characteristics were evaluated.

[Dimensions of Organic Semiconductor Layers 6]

Figure 12:
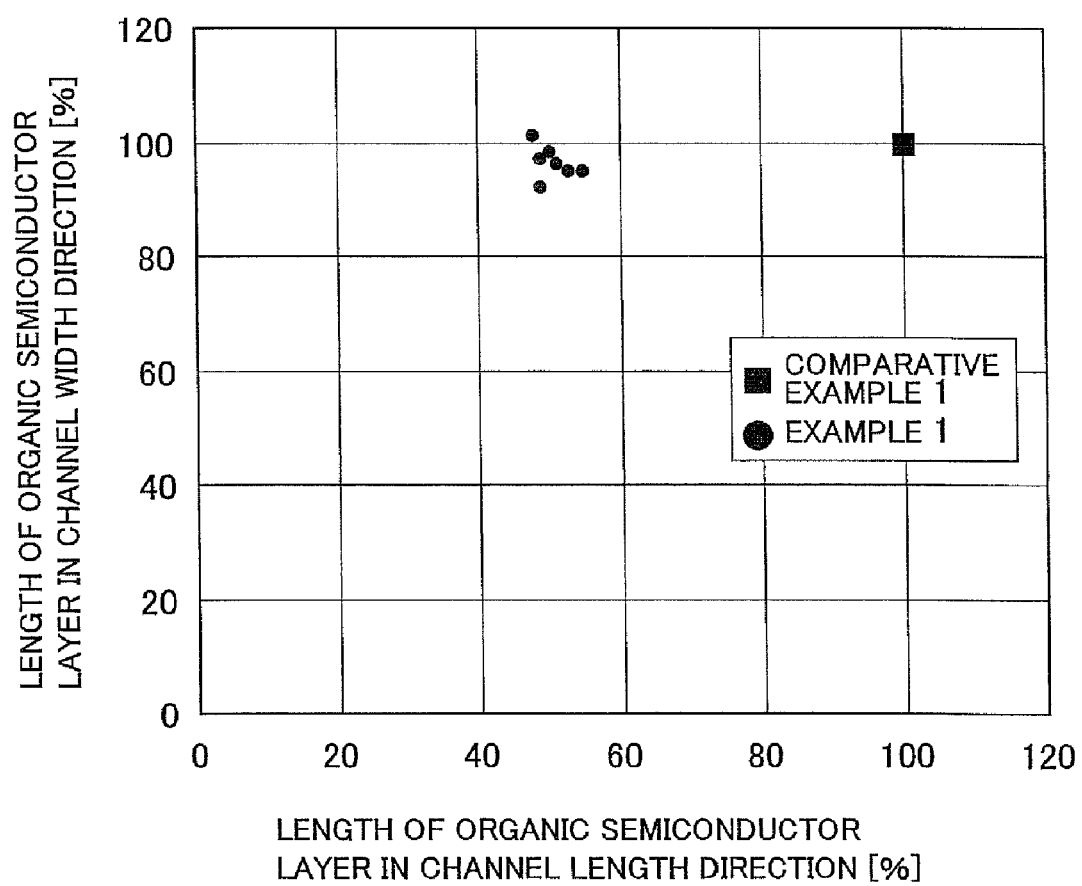
FIG. 12 shows a dimensional difference between Example 1 and Comparative Example 1.

According to the measurements using a metallograph, the organic semiconductor layer 6 of Comparative Example 1 had dimensions of about 100 μm in both the channel width direction and the channel length direction. On the other hand, as for the organic semiconductor layer 6 of Example 1, the dimension in the channel length direction is about 50% of that of Comparative Example 1 (see FIG. 12). Thus, it can be seen that the spread of the organic semiconductor layer 6 can be controlled by the geometry of the drain electrode 5. Accordingly, the pattern of the organic semiconductor layer 6 can be formed with high precision in a stable manner.

[Transistor Static Characteristics]

The transistor static characteristics of Example 1 were evaluated by applying a drain voltage $V_{ds}$ of −20 V and scanning the gate voltage $V_g$ from +20 V to −20 V under the

[Chemical Formula (B)]

Figure 13:
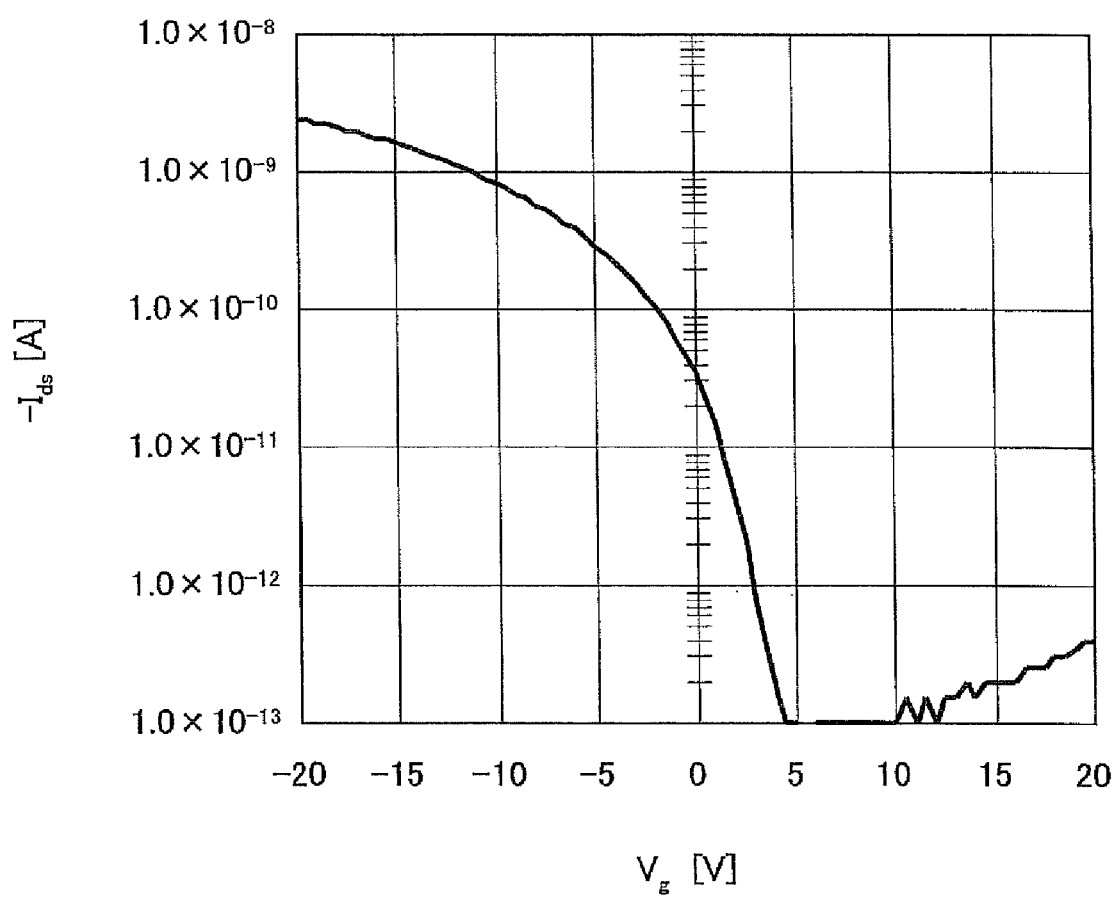
FIG. 13 shows transistor static characteristics of an organic transistor of Example 1.

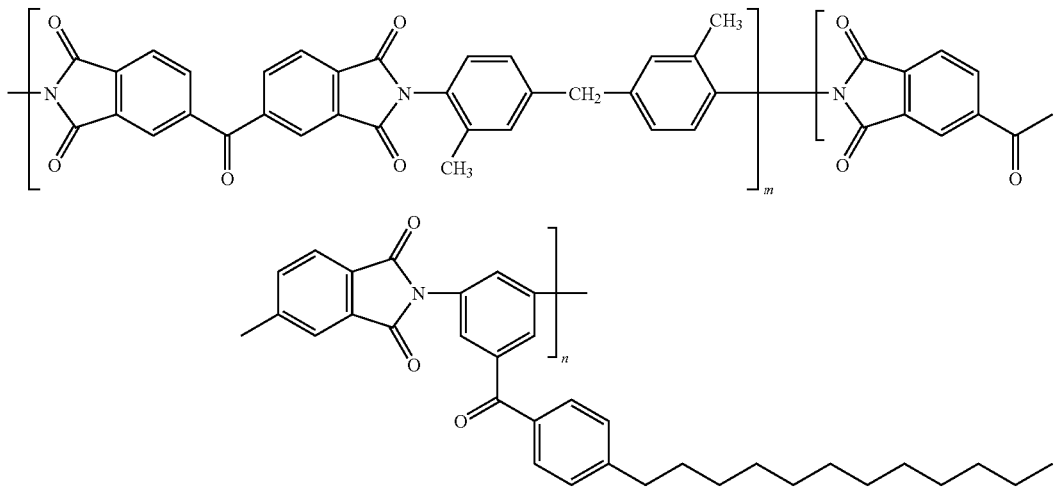

atmosphere of less than 1 ppm oxygen and less than 1 ppm moisture (see FIG. 13). The results were that an ON current $I_{ds}$ was $2.4 \times 10^{-9}$ A ($V_g$=−20 V); an OFF current $I_{ds}$, $4.0 \times 10^{-13}$ A (Vg=+20 V); and an ON-OFF ratio ($V_g$(−20 V)/$V_g$ (+20V)), $6.0 \times 10^3$ (see FIG. 13). As for the ON current and the OFF current, the respective values were obtained by averaging measurements at twenty locations. Similarly, the transistor static characteristics of Comparative Example 1 were evaluated. The results were that the ON current $I_{ds}$ was 1.8×

$10^{-9}$ A ($V_g=-20$ V); the OFF current $I_{ds}$, $7.2\times10^{-13}$ A (Vg=+20 V); and the ON-OFF ratio ($V_g(-20$ V$)/V_g(+20$ V$)$), $2.5\times10^3$. Herewith, it can be seen that the organic transistor 10 of Example 1 achieves favorable transistor static characteristics compared to the organic transistor of Comparative Example 1.

[Gate Leakage Current]

Figure 14:
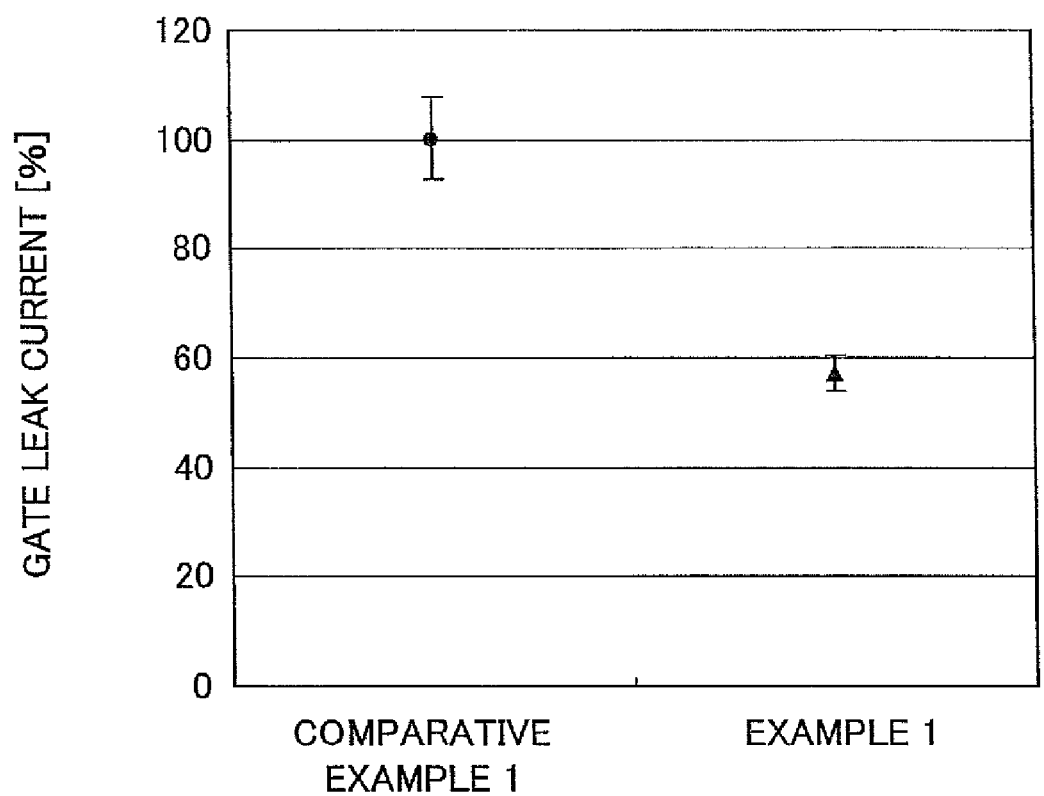
FIG. 14 shows gate leakage currents of organic transistors of Example 1 and Comparative Example 1.

The gate leakage currents in an OFF state with $V_g=+20$ V and $V_{ds}=-20$ V were evaluated (see FIG. 14). From FIG. 14, it can be understood that the leak current was significantly reduced in the organic transistor 10 of Example 1 compared to the organic transistor of Comparative Example 1. This is because the organic transistor 10 of Example 1 has a smaller overlap area of the gate electrode 2 and the drain electrode 5 than that of the organic transistor of Comparative Example 1 (see FIG. 6).

[Transistor Dynamic Characteristics]

Figure 15:
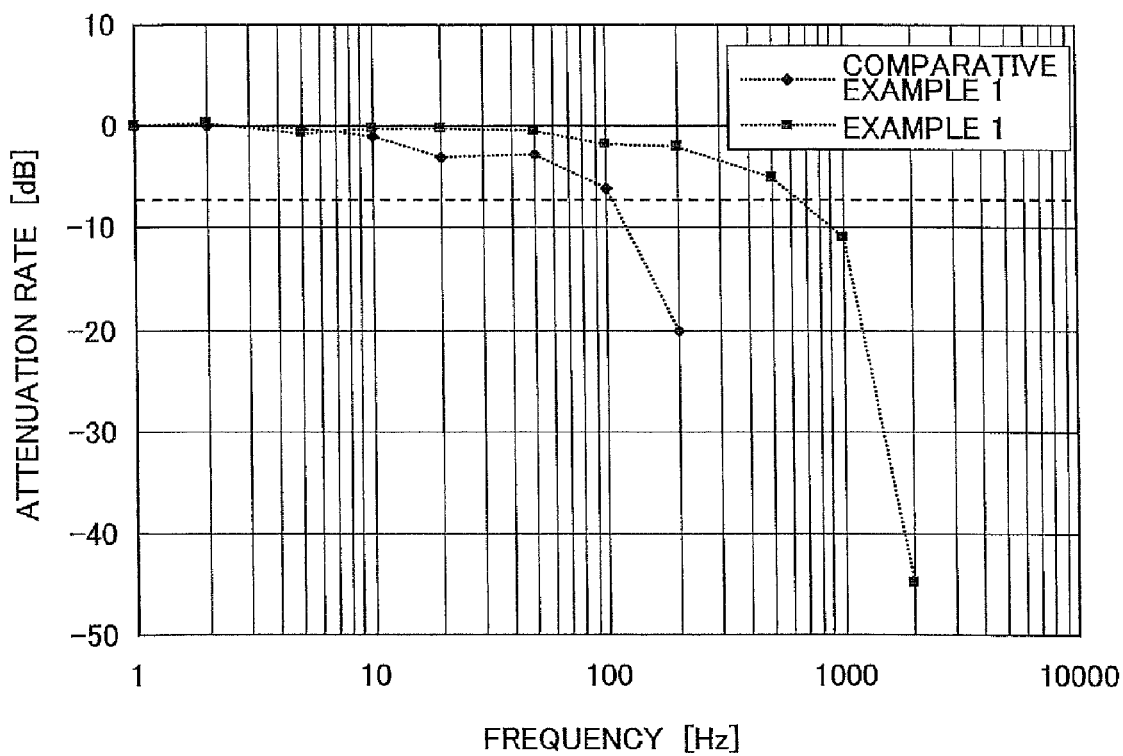
FIG. 15 shows transistor dynamic characteristics of the organic transistors of Example 1 and Comparative Example 1.

The transistor dynamic characteristics were evaluated by measuring an output current obtained when a gate voltage $V_g$ of $-20$ V was applied at a frequency between 1 Hz and 2000 Hz while a drain voltage $V_{ds}$ of $-20$ V was being applied (see FIG. 15). The results were that the cutoff frequency of Example 1 was about 650 Hz while the cutoff frequency of Comparative Example 1 was about 110 Hz. Thus, it can be seen that the organic transistor 10 of Example 1 achieves better transistor dynamic characteristics compared to the organic transistor of Comparative Example 1. Note that the cutoff frequency was defined as a frequency obtained when the attenuation rate is $-6$ dB.

Example 2

Example 2 is the organic transistor array 20 having a two dimensional array of 32×32 organic transistors 10 with an interelement spacing of 500 μm. The organic transistor array 20 of Example 2 is formed in the same manner as in Example 1.

The transistor static characteristics of Example 2 were evaluated in the same manner as described above. The results were that the ON current $I_{ds}$ was $2.2\times10^{-9}$ A ($V_g=-20$ V); the OFF current $I_{ds}$, $3.8\times10^{-13}$ A (Vg=+20 V); and the ON-OFF ratio ($V_g(-20$ V$)/V_g(+20$ V$)$), $5.8\times10^3$.

Due to being able to control the spread of the organic semiconductor layer 6, the pattern of the organic semiconductor layer 6 was formed with a uniform thickness in a stable manner. As a result, the variation of the static characteristics of the organic transistors 10 could be controlled down to 10% or less for both the ON current and OFF current.

Comparative Example 2

Comparative Example 2 is the organic transistor array 20 having a two dimensional array of 32×32 organic transistors 10 with an interelement spacing of 500 μm. The organic transistor array 20 of Comparative Example 2 is formed in the same manner as in Comparative Example 1.

The transistor static characteristics of Comparative Example 2 were evaluated in the same manner as described above. The results were that the ON current $I_{ds}$ was $1.9\times10^{-9}$ A ($V_g=-20$ V); the OFF current $I_{ds}$, $6.3\times10^{-13}$ A (Vg=+20 V); and the ON-OFF ratio ($V_g(-20$ V$)/V_g(+20$ V$)$), $3.0\times10^3$.

However, the thickness uniformity and the pattern of the organic semiconductor layer 6 were difficult to control. Accordingly, the transistor static characteristics varied largely among the organic transistors with up to about 30% variation in the ON current and up to about 70% variation in the OFF current.

Example 3

Figure 16:
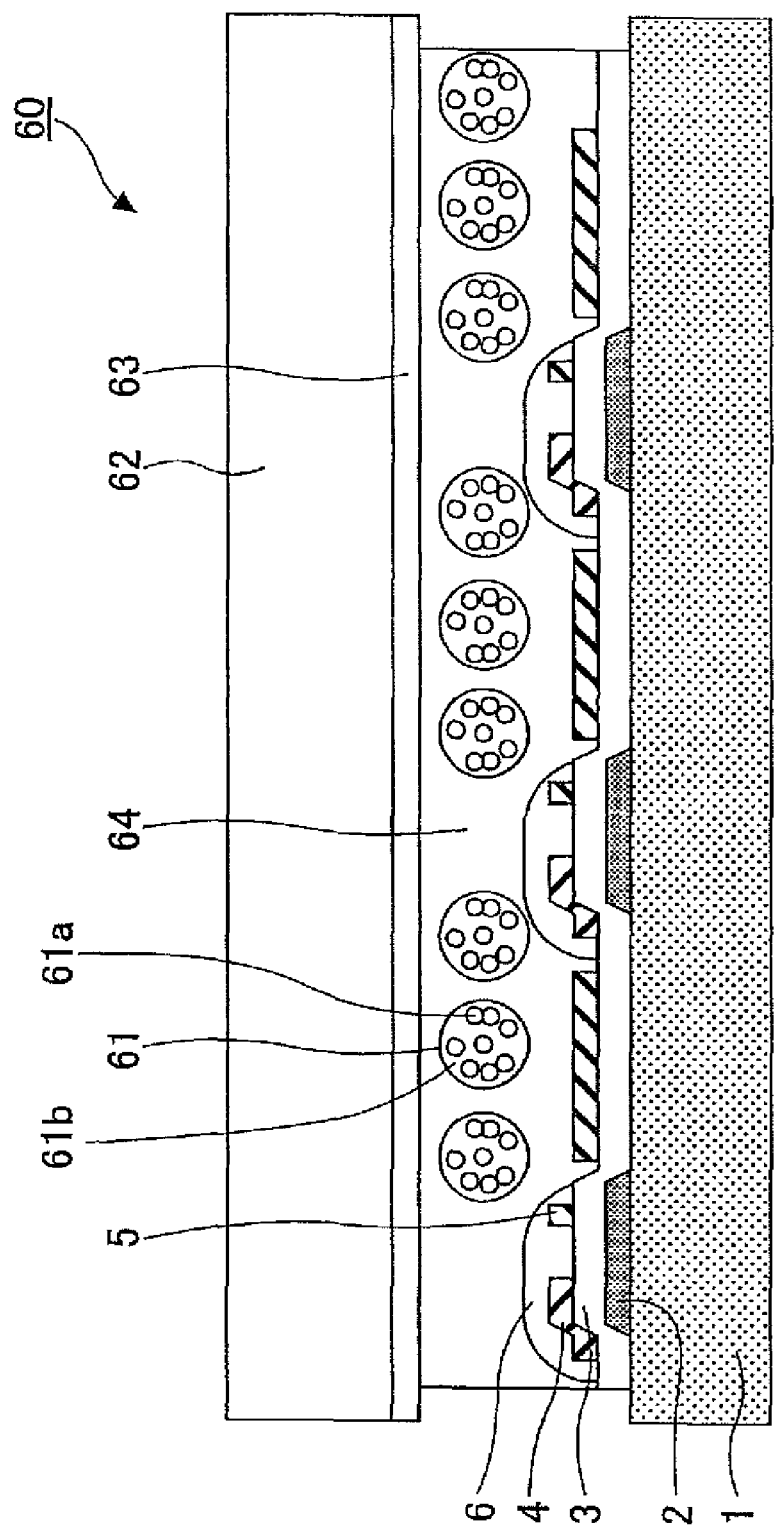
FIG. 16 is a cutaway view of an active matrix display apparatus of Example 3.

Example 3 is an active matrix display apparatus 60 (see FIG. 16). The active matrix display apparatus 60 is made using the organic transistor array 20 of Example 2. Specifically, an application liquid made by mixing microcapsules 61, which include titanium oxide particles 61a and Isoper 61b dyed with Oil Blue, and a polyvinyl alcohol aqueous solution is applied to a transparent electrode 63 made of ITO and disposed on a polycarbonate substrate 62 to thereby form a layer including the microcapsules 61 and a binder 64. The created laminated structure and the organic transistor array 20 of Example 2 are bonded with each other by the binder 64 in a manner that the glass substrate 1 and the polycarbonate substrate 62 respectively form outermost surfaces of the active matrix display apparatus 60.

To evaluate the active matrix display apparatus 60 made in the above-described manner, scanning signal driver ICs were connected to bus lines leading to the gate electrodes 2 of the active matrix display apparatus 60 while data signal driver ICs were connected to bus lines leading to the source electrodes 4. When images were changed every 0.5 seconds, it was confirmed that favorable still images were displayed.

According to the present invention, it is possible to provide an organic transistor in which the pattern formation of the organic semiconductor layer can be controlled and the overlap between the gate electrode and the source/drain electrode can be reduced. Also, the present invention is able to provide an organic transistor array having two or more of such transistors as well as a display apparatus including the organic transistor array.

This application is based upon and claims the benefit of priority of Japanese Patent Application 2007-317380, filed on Dec. 7, 2007, the entire contents of which are hereby incorporated herein by reference.

The invention claimed is:

1. An organic transistor comprising:
   a substrate;
   a gate electrode;
   a gate insulating film;
   source-drain electrodes; and
   an organic semiconductor layer;
   wherein the gate electrode and the gate insulating film are disposed on the substrate in this stated order, and the source-drain electrodes and the organic semiconductor layer are disposed at least on the gate insulating film in this stated order, and
   at least one of the source-drain electrodes includes a first part disposed directly above the gate electrode, a second part disposed not over the gate electrode, and a connecting part which has a width smaller than a width of the first part and connects the first part and the second part, and wherein
   a first surface area of the gate insulating film, on which the source-drain electrodes are not disposed, has a surface energy of 40 mN/m or less.

2. The organic transistor as claimed in claim 1, wherein the organic semiconductor layer is formed by a printing process.

3. The organic transistor as claimed in claim 1, wherein the organic semiconductor layer includes an organic semiconductor material soluble in an organic solvent.

4. The organic transistor as claimed in claim 1, wherein a second surface area of the gate insulating film, on which the source-drain electrodes are disposed, has a higher surface energy than a surface energy of a first surface area of the gate insulating film, on which the source-drain electrodes are not disposed.

5. The organic transistor as claimed in claim 4, wherein the second surface area is irradiated with ultraviolet light.

6. The organic transistor as claimed in claim 1, wherein the gate insulating film includes a polymer material.

7. The organic transistor as claimed in claim 1, wherein at least one of the gate electrode and the source-drain electrodes is formed by a printing process.

8. The organic transistor as claimed in claim 7, wherein at least one of the gate electrode and the source-drain electrodes is formed using ink that includes metal particles or a metal complex.

9. The organic transistor as claimed in claim 8, wherein the metal particles includes at least one selected from the group consisting of Au, Ag, Cu and Ni.

10. The organic transistor as claimed in claim 1, wherein at least one of the gate electrode and the source-drain electrodes includes a conductive polymer.

11. The organic transistor as claimed in claim 10, wherein the conductive polymer includes polyethylene dioxythiophene.

12. An organic transistor array including a plurality of organic transistors, each of which includes a substrate; a gate electrode; a gate insulating film; source-drain electrodes; and an organic semiconductor layer; wherein the gate electrode and the gate insulating film are disposed on the substrate in this stated order, and the source-drain electrodes and the organic semiconductor layer are disposed at least on the gate insulating film in this stated order; at least one of the source-drain electrodes includes a first part disposed above the gate electrode, a second part, and a connecting part which has a width smaller than a width of the first part and connects the first part and the second part; and the organic semiconductor layer is formed by a printing process; and wherein a first surface area of the gate insulating film, on which the source-drain electrodes are not disposed, has a surface energy of 40 mN/m or less.

13. A display apparatus including an organic transistor array that includes a plurality of organic transistors, each of which includes a substrate; a gate electrode; a gate insulating film; source-drain electrodes; and an organic semiconductor layer; wherein the gate electrode and the gate insulating film are disposed on the substrate in this stated order, and the source-drain electrodes and the organic semiconductor layer are disposed at least on the gate insulating film in this stated order; at least one of the source-drain electrodes includes a first part disposed above the gate electrode, a second part, and a connecting part which has a width smaller than a width of the first part and connects the first part and the second part; and the organic semiconductor layer is formed by a printing process; and wherein a first surface area of the gate insulating film, on which the source-drain electrodes are not disposed, has a surface energy of 40 mN/m or less.

* * * * *